US008433976B1

(12) United States Patent
Demirsoy

(10) Patent No.: US 8,433,976 B1
(45) Date of Patent: Apr. 30, 2013

(54) ROW COLUMN INTERLEAVERS AND DEINTERLEAVERS WITH EFFICIENT MEMORY USAGE

(75) Inventor: Suleyman Sirri Demirsoy, Ickenham (GB)

(73) Assignee: Altera Corporation, San Jose, CA (US)

( * ) Notice: Subject to any disclaimer, the term of this patent is extended or adjusted under 35 U.S.C. 154(b) by 482 days.

(21) Appl. No.: 12/768,252

(22) Filed: Apr. 27, 2010

(51) Int. Cl.
*H03M 13/00* (2006.01)
*G11C 29/00* (2006.01)
*G06F 13/00* (2006.01)
*G06F 13/28* (2006.01)

(52) U.S. Cl.
USPC ........... 714/763; 714/752; 714/769; 714/779; 714/770; 714/773; 711/157

(58) Field of Classification Search .................. None
See application file for complete search history.

(56) References Cited

U.S. PATENT DOCUMENTS

| | | | |
|---|---|---|---|
| 4,654,849 A * | 3/1987 | White et al. | 714/718 |
| 2006/0156134 A1* | 7/2006 | Mukherjee et al. | 714/733 |
| 2009/0265592 A1* | 10/2009 | Wu et al. | 714/718 |
| 2010/0017649 A1* | 1/2010 | Wu et al. | 714/6 |

OTHER PUBLICATIONS

Parallel testing of multi-port static random access memories F. Karimia, S. Irrinkib, T. Crosbyb, N. Parkc,*, F. Lombardi Journal 34 (2003).*
An Interleaver Implementation for the Serially Concatenated Pulse-Position Modulation Decoder Michael K. Cheng, Bruce E. Moision, Jon Hamkins, and Michael A. Nakashima Jet Propulsion Laboratory, California Institute of Technology, Pasadena, CA 91109-8099.*

* cited by examiner

*Primary Examiner* — Guerrier Merant
(74) *Attorney, Agent, or Firm* — Mauriel Kapouytian & Treffert LLP; Ararat Kapouytian

(57) ABSTRACT

Interleaver designs and interleaving methods that perform block-wise interleaving by reading blocks into and out of memories, where a block can be written to the memory before another block has finished being read out of the memory, without data clashes, are provided. Corresponding deinterleavers and deinterleaving methods are disclosed.

20 Claims, 9 Drawing Sheets

Interleaving →

| $w''[t]$ | $r''[t] = w[t]$ | $r[t]$ |
|---|---|---|
| 0 | 0    0 | 0 |
| $R$ | 1    1 | $C$ |
| $2R$ | 2    2 | $2C$ |
| ⋮ | ⋮    ⋮ | ⋮ |
| $R(C-1)$ | $C-1$    $R-1$ | $(R-1)C$ |
| 1 | $C$    $R$ | 1 |
| $R+1$ | $C+1$    $R+1$ | $C+1$ |
| ⋮ | ⋮    ⋮ | ⋮ |
| 2 | $2C$    $2R$ | 2 |
| ⋮ | ⋮    ⋮ | ⋮ |
| $RC-1$ | $RC-1$    $RC-1$ | $RC-1$ |

$r_d''[t]$    $w_d''[t] = r_d[t]$    $w_d[t]$

← deinterleaving

|   |   |   |   |   |   |   |   |
|---|---|---|---|---|---|---|---|
| $w0$ | $w1$ | $w2$ | $\cdots$ | $w(C-1)$ | $r0$ | $rR$ | $r2R$ | $\cdots$ | $r(C-1)R$ |
| $wC$ | $w(C+1)$ | $\cdots$ | | $w(2C-1)$ | $r1$ | $r(R+1)$ | | | $r(C-1)R+1$ |
| $w2C$ | $w(2C+1)$ | $\cdots$ | | $w(3C-1)$ | $r2$ | $r(R+2)$ | $\vdots$ | | $\vdots$ |
| $\vdots$ | | | | | $\vdots$ | | | | |
| $w(R-1)C$ | $\cdots$ | | | $w(RC-1)$ | $r(R-1)$ | $r(2R-1)$ | | | $r(CR-1)$ |

1 — left table; 2 — right table

FIG. 1

| | |
|---|---|
| 0 | $w0$ |
| 1 | $w1$ |
| 2 | $w2$ |
| $\vdots$ | $\vdots$ |
| $C-1$ | $w(C-1)$ |
| $C$ | $wC$ |
| $C+1$ | $w(C+1)$ |
| $\vdots$ | $\vdots$ |
| $2C$ | $w2C$ |
| $\vdots$ | $\vdots$ |
| $RC-1$ | $w(RC-1)$ |

FIG. 2

| | |
|---|---|
| 0 | $r0$ |
| 1 | $rR$ |
| 2 | $r2R$ |
| $\vdots$ | $\vdots$ |
| $C-1$ | $r(C-1)R$ |
| $C$ | $r1$ |
| $C+1$ | $r(R+1)$ |
| $\vdots$ | $\vdots$ |
| $2C$ | $r2$ |
| $\vdots$ | $\vdots$ |
| $RC-1$ | $r(RC-1)$ |

FIG. 3

ROW COLUMN INTERLEAVERS AND DEINTERLEAVERS WITH EFFICIENT MEMORY USAGE

BACKGROUND

The invention relates to the field of interleaving and deinterleaving of data.

In the field of communications, forward error correction (FEC) coding is typically applied to blocks of data that are to be transmitted and this type of coding normally allows successful recovery from errors that affect relatively short parts of a received data block. Interleaving is a technique that is commonly used to reduce the chance that an error will affect a relatively long part of a received data block, as will now be explained.

Prior to transmission, the data items within an FEC encoded data block can be shuffled into a different order. This shuffling is referred to as interleaving and swaps the data items from a first pre-defined order to a second pre-defined order. After reception, the data items of the block are shuffled back into their original order. This shuffling is referred to as deinterleaving and swaps the data items from the second pre-defined order to the first pre-defined order. If interference during transmission causes an error over a part of the received version of the interleaved block, then the deinterleaving process distributes the error to various locations within the block. That is to say, after deinterleaving, the error is less likely to affect a contiguous part of the received block that is of sufficient length to impede recovery from the (dispersed) error by applying FEC decoding.

Recent wireless communications standards such as the Long Term Evolution (LTE) project by the Third Generation Partnership Project (3GPP) use large transport blocks. A channel interleaver/deinterleaver for such blocks will require considerable amounts of memory storage. A "single buffer" approach of writing a data block into an addressable memory in an interleaved order and then subsequently reading the data block out of the memory in a deinterleaved order may be undesirably slow, particularly where the block size is large. A "double buffer" approach of writing a data block into one addressable memory in an interleaved order whilst reading another data block out of another addressable memory in a deinterleaved order is faster but is costly in terms of silicon area.

SUMMARY

According to one embodiment, an aspect of the invention provides a method of rearranging data within a memory, the method including: writing a first block of data having a first order to a set of locations in the memory in a first sequence; reading the set of locations in a second sequence to recover the first block of data in a second order; writing a second block of data having the first order to the set of locations in the second sequence; reading the set of locations in a third sequence to recover the second block of data in the second order; where: the writing of the second block of data to the set of locations is performed after the reading of a datum of the first block of data that is stored in a first location according to the second sequence; and the first order is one of a pair of orders consisting of a deinterleaved order of a row-column interleaving scheme and an interleaved order of the row-column interleaving scheme and the second order is another one of the pair.

Thus, an interleaving method or a deinterleaving method is provided in which a second block can be re-ordered by writing into and then reading from the same group of memory locations that are used to re-order a first block, and without hampering the re-ordering of the first block by overwriting unread data. It is also possible to closely interweave the re-ordering of the blocks in the time domain so as to shorten the process of re-ordering the two blocks.

In certain embodiments, more than two blocks are re-ordered.

Embodiments of the invention also include an apparatus for performing data re-ordering.

BRIEF DESCRIPTION OF THE DRAWINGS

The novel features of the invention are set forth in the appended claims. However, for purpose of explanation, several aspects of particular embodiments of the invention are described by reference to the following figures.

FIG. 1 is a table illustrating writing and reading orders for a row-column interleaving process;

FIG. 2 illustrates address mapping for writing data to a memory;

FIG. 3 illustrates address mapping for reading data from a memory;

FIG. 7b illustrates schematically an optimised version of the subcircuit of FIG. 7a;

FIG. 8b illustrates schematically an optimised version of the subcircuit of FIG. 8a;

FIG. 10b schematically illustrates an optimised version of the subcircuit of FIG. 10a;

DETAILED DESCRIPTION

Figure 4:
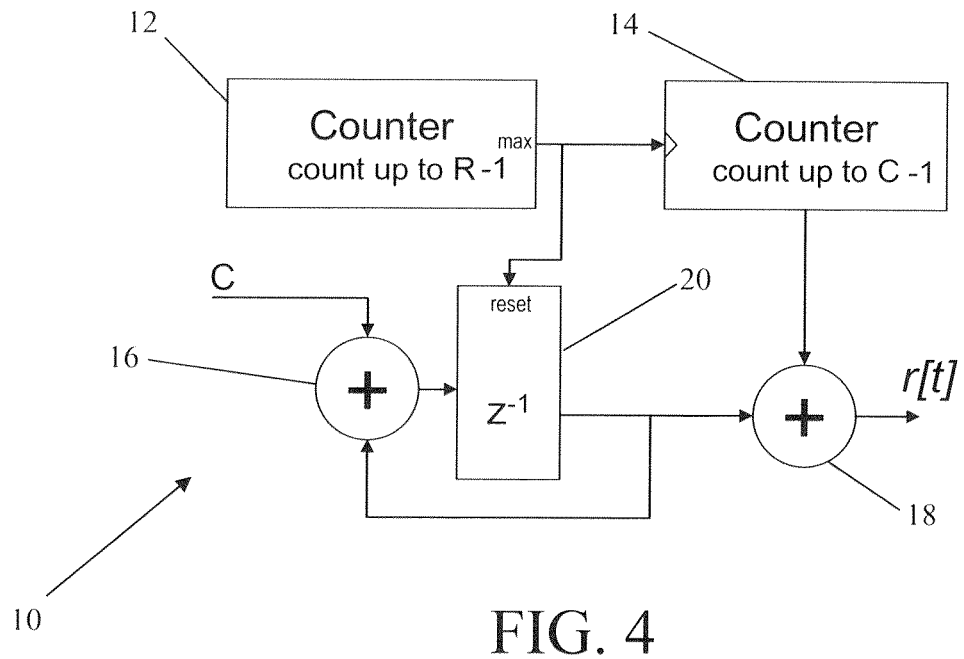
FIG. 4 schematically illustrates an address sequence generator.

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Ignoring any standard-specific details, we can describe row-column interleaving as follows.

An R×C sized data block, where R corresponds to number of rows and C corresponds to number of columns, gets written into a two-dimensional virtual memory of size R by C row by row and read in column by column fashion. FIG. 1 shows how the write and read addresses progress in this virtual memory. Block 1 (which may also herein be referred to as virtual rectangular data block 1) of FIG. 1 shows that the data gets written into the rectangular virtual memory row by row, starting from the top left entry with write operation w0 and finishing in the bottom right entry with write operation w(RC-1). Block 2 (which may also herein be referred to as virtual rectangular data block 2) of FIG. 1 shows that the data gets read out of the rectangular virtual memory column by column, starting from the top left entry with read operation r0 and finishing in the bottom right entry with read operation r(CR-1).

The deinterleaving operation uses the address pattern shown in block 1 of FIG. 1 for writing data and the addressing pattern shown in block 2 of FIG. 1 for reading for an R×C sized block, and in this sense is the inverse of the interleaving process. For the remainder of the "Detailed Description" section, the focus will be on embodiments of the invention that perform interleaving, it being understood that an "inverse" process is used to carry out deinterleaving using embodiments of the invention.

The physical memory addressing will need to manage the row and column addresses that are shown as two dimensions in FIG. 1. The physical memory stores the virtual rectangular block of data as a one dimensional array. The system designer has the choice of mapping the rectangle onto the single dimension as he wishes. One possible mapping that would require minimal write address generation hardware is shown in FIG. 2.

The left-hand column of FIG. 2 shows the physical address location and the right-hand column shows which data from the virtual rectangular data block 1 (shown in FIG. 1) it would store. The hardware for generating the addressing sequence is simply a counter that increases its value monotonically:

$$w[t]=t, t=0,1,2\ldots, RC-1$$

Based on the mapping specified in FIG. 2, the read sequence can be mapped as shown in FIG. 3. The physical memory locations are again shown in the left-hand column. The right-hand column shows the read address sequence. The read address sequence mapping to the physical address space can be shown with the below expression:

$$r[t]=(t \bmod R)C+\lfloor t/R \rfloor, t=0,1,2\ldots, RC-1$$

The $\lfloor \bullet \rfloor$ operator signifies floor operation where the integer part of the input value is returned. The expression for r[t] can be implemented in hardware as shown in FIG. 4.

The circuit 10 shown in FIG. 4 includes two counters 12 and 14, two adders 16 and 18 and a register 20. Counter 12 counts cyclically from 0 up to R-1 and counter 14 counts cyclically from 0 up to C-1 Adder 16 adds the value C to the value stored in register 20. The value stored in register 20 is the output of the adder 16 from the previous clock cycle. The counting performed by counter 12 represents the monotonic advance of parameter t. Upon reaching its maximum value, counter 12 triggers counter 14 to advance its count to its next value and also triggers a reset of the content of register 20. The output of register 20 is added by adder 18 to the output of counter 14 in order to give the current value of r[t].

The deinterleaver operation can be readily defined with the two equations obtained above, all that is required is a swap of the read and the write sequences. The write sequence $w_d[t]$ and the read sequence $r_d[t]$ for the deinterleaver operation are:

$$w_d[t]=r[t]$$

$$r_d[t]=w[t]$$

If a natural order read address pattern for the interleaver is desired, i.e., it is desired that $r''[t]=t$, then we can find a write address sequence in a similar way to the above:

$$w''[t]=(t \bmod C)R+\lfloor t/C \rfloor, t=0,1,2\ldots, RC-1$$

The corresponding deinterleaver patterns are:

$$w_d''[t]=r''[t]$$

$$r_d''[t]=w''[t]$$

Figure 5:
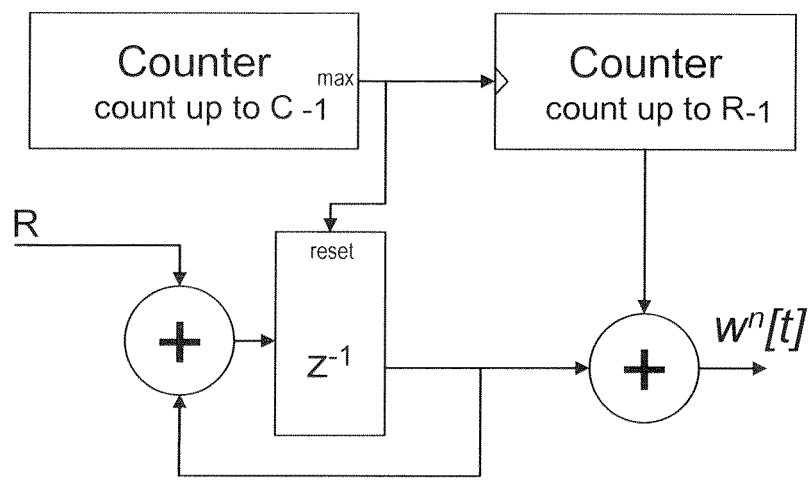
FIG. 5 schematically illustrates another address sequence generator.

This would lead to a hardware circuit very similar to FIG. 4 where all Rs and Cs are swapped, as is shown in FIG. 5. Given the earlier description of the blocks in FIG. 4, a skilled person will be able to understand FIG. 5 readily without the need for further discussion here.

By way of explanation, the n superscript denotes a read or write pattern flowing from the decision to use the natural addressing order of the physical memory for reading data out of the memory and the absence of that superscript denotes a read or write pattern flowing from the decision to use the natural addressing order of the physical memory for writing data into the memory.

Figure 6:
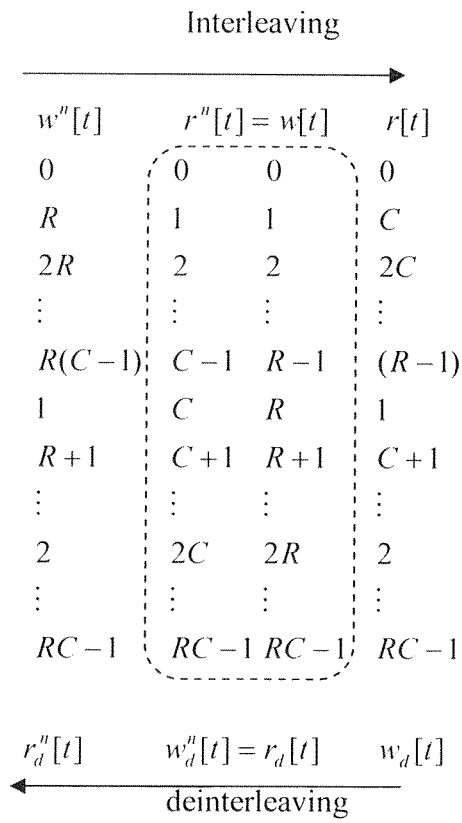
FIG. 6 illustrates a set of addressing patterns.

The addressing patterns deduced thus far can be written down next to each other, as shown in FIG. 6. The middle two columns, bounded by the dashed line, are the same, natural order (monotonically increasing) address sequence. In actuality then, FIG. 6 contains three columns, each defining a separate addressing pattern. Moving from left to right across the three columns of FIG. 6, two related rounds of interleaving are performed: a first one in going from the left-hand column to the middle column (in which the block is written in using addressing sequence w″[t] and read out using addressing sequence r″[t]) and a second one in going from the middle column to the right-hand column (in which the block is written in using addressing sequence w[t](=r″[t]) and read out using addressing sequence r[t]). On the other hand, in moving from right to left across the three columns of FIG. 6, two related rounds of deinterleaving are performed: a first one in going from the right-hand column to the middle column (in which the block is written in using addressing sequence $w_d[t]$ and read out using addressing sequence $r_d[t]$) and a second one in going from the middle column to the left-hand column (in which the block is written in using addressing sequence $w_d''[t](=r_d[t])$ and read out using addressing sequence $r_d''[t]$).

The related interleaving rounds of FIG. 6 can be used to conduct an efficient form of interleaving as will now be explained.

A first transport block can be written into the physical memory using the addressing sequence specified in the left-hand column of FIG. 6. Then, the first transport block can be read out in the order specified in the middle column of FIG. 6. As soon as one item of the first transport block has been read from the physical memory, the writing of a second transport block into the physical memory can commence. The writing of the second transport block into the physical memory also uses the order specified in the middle column of FIG. 6. This ensures that no unread data is overwritten in the process of writing the second transport block into the physical memory. The writing of the second transport block need not start immediately after the reading of a first item of the first transport block from the physical memory. However, if the second transport block is readily available, then the interleaving process can be quickened by arranging that, after each item or "datum" of the first transport block is read out from its location in the physical memory, an item of a second transport block is written into that location before proceeding to read the next item of the first transport block from its location. In this way, the writing of a second transport block is interdigitated with the reading of a first transport block from the memory.

With the second transport block thus written in the memory, it can be read out in the interleaved order by reading the content of the memory in the order specified in the right-hand column of FIG. 6. By using this approach, two transport blocks can be interleaved successively without experiencing either the earlier described "single buffer" latency or "double buffer" hardware expense. For the remainder of the "Detailed Description" section, this writing of a block into memory locations in a sequence that has been, or is being, used to read out a preceding block will be referred to as "in-place addressing".

In-place addressing allows one block to be written whilst another block is being read; this is especially useful when the data blocks are large and the buffer space is limited. In the LTE standard, the maximum R value a user data block can have is 1296 and C can be a maximum of 12. The maximum size of a transport block for 64 QAM modulation with 8-bit soft bits is therefore 746,496 bits which in state of the art Altera® Corp. products would require six M144K memory blocks. Double buffering for this block size is very expensive and should be avoided if the latency figures from single buffer implementations are sufficient. The LTE standard admits the possibility of a receiver having two receiver circuits with respective antennae, with each receiver circuit producing its own version of a transport block. In such a scenario, the in-place addressing scheme described with the help of FIG. 6 allows the two versions of the transport block to be deinterleaved (recall that progressing from right to left across the columns of FIG. 6 represents deinterleaving) at relatively low latency without incurring a relatively high memory overhead.

The in-place addressing scheme of FIG. 6 performs two rounds of interleaving, or of deinterleaving. However, the scheme can be extended to include further rounds. If we assume the r[t] sequence is used for writing a $3^{rd}$ data block into the interleaver, then the resulting read sequence will be:

$$r \bigcirc r[t] = (r[t] \bmod R)C + \lfloor r[t]/R \rfloor$$

The resulting hardware includes a divider and a modulus operator. Although they are not desirable hardware operators in terms of area requirement, it can be an acceptable penalty to pay for very large saving on memory. It will be shown below that by modifying the original implementation, we can further optimize the implementation of $r \bigcirc r[t]$.

$$r \circ r[t] = (r[t] \bmod R)C + \lfloor r[t]/R \rfloor =$$

$$\underbrace{([(t \bmod R)C + \lfloor t/R \rfloor] \bmod R)C}_{r1[t]} + \underbrace{\lfloor r[t]/R \rfloor}_{r2[t]} \ r1[t] =$$

$$\left( \left[ (t \bmod R) \left( \frac{C \bmod R}{C} \right) \right] \bmod R + \lfloor t/R \rfloor \bmod R \right) C$$

Figure 7A:
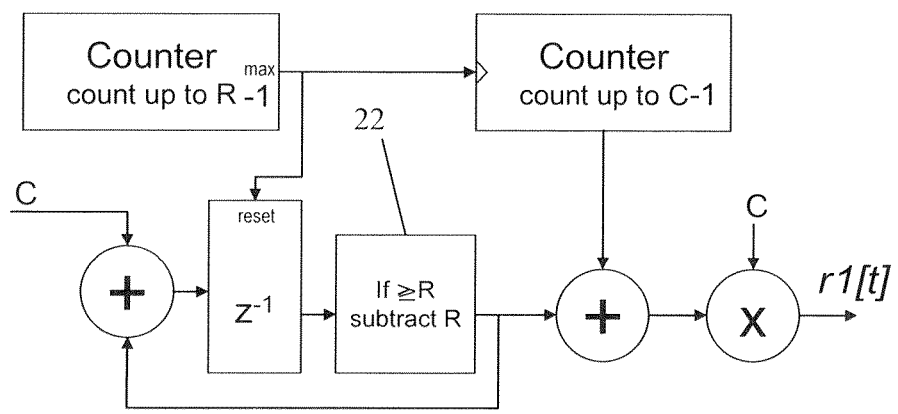
FIG. 7a illustrates schematically a subcircuit for an address sequence generator.
Figure 7B:
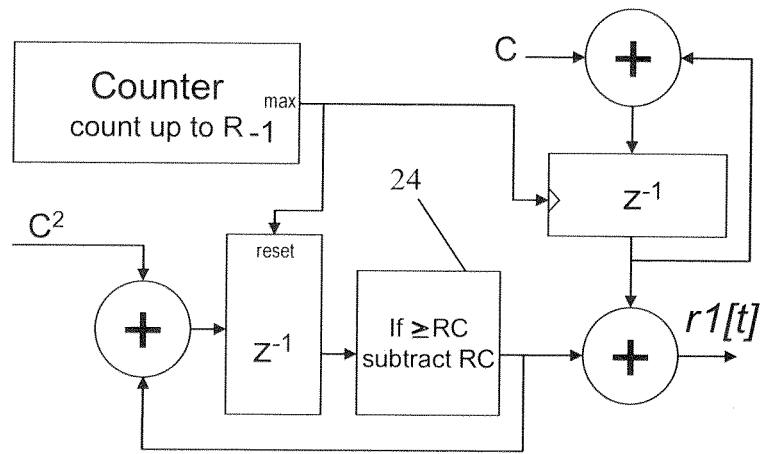
Figure 8A:
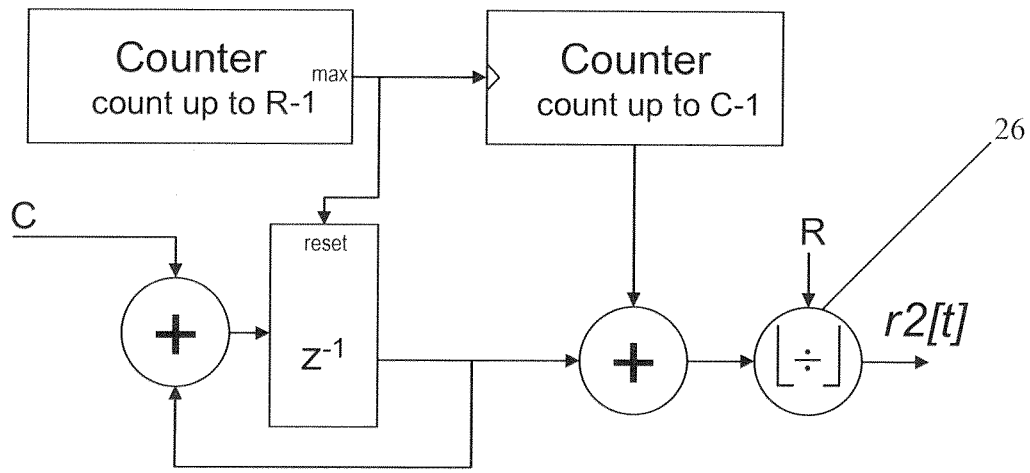
FIG. 8a illustrates schematically another subcircuit for an address sequence generator.
Figure 8B:
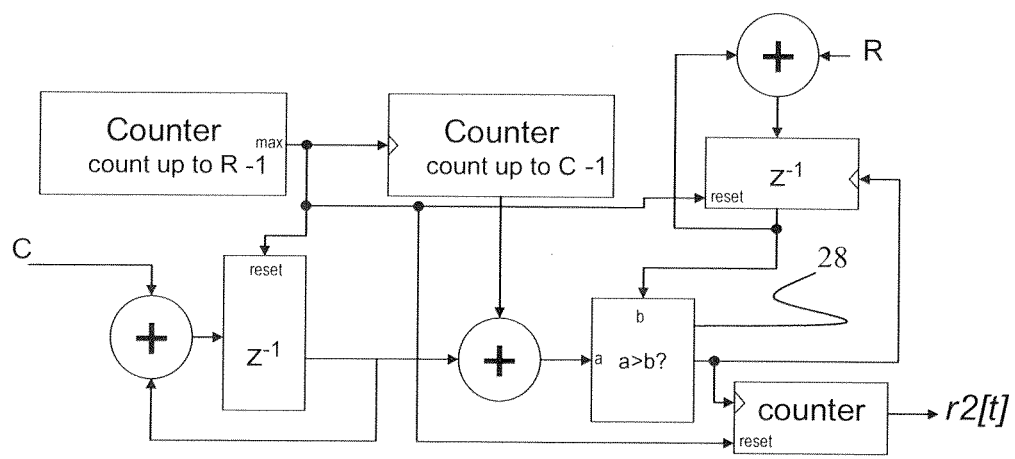
Figure 9:
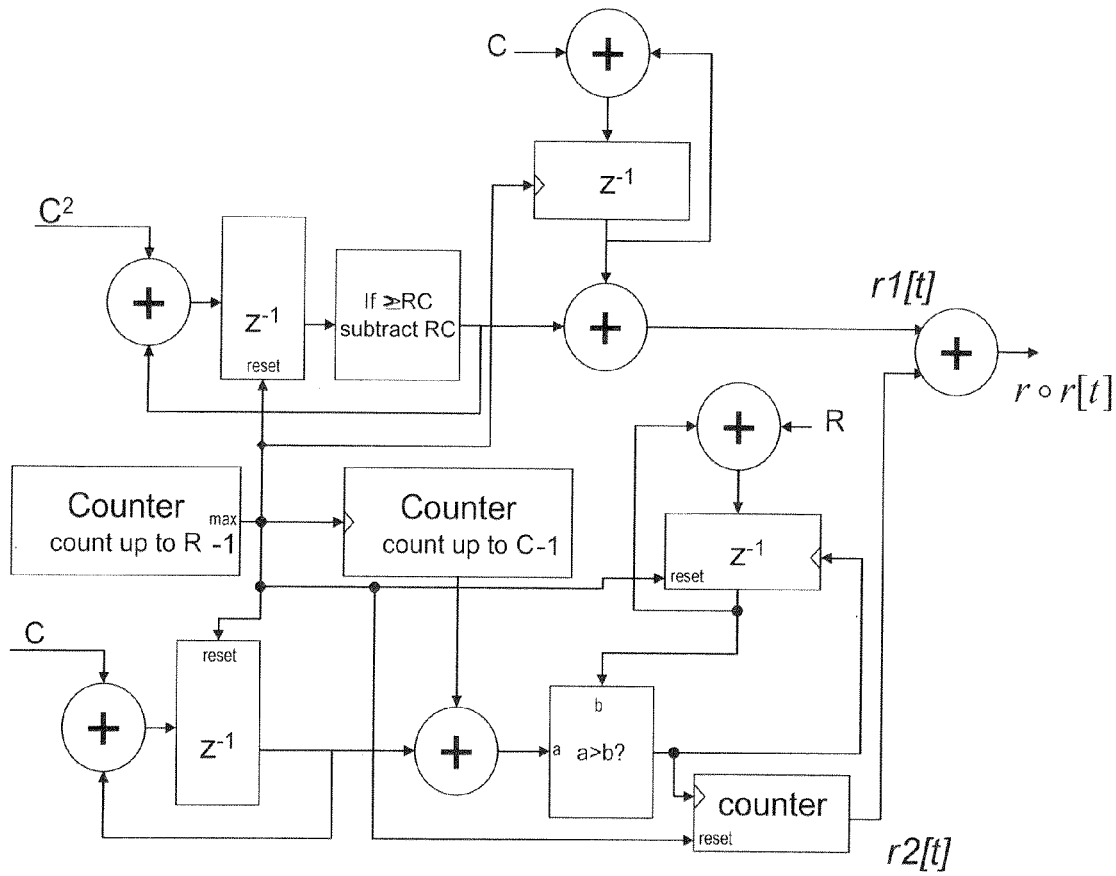
FIG. 9 illustrates schematically an address sequence generator combining the subcircuits of FIGS. 7b and 8b.

FIGS. 7(a) and 7(b) respectively show basic and optimised hardware implementations of r1[t] and FIGS. 8(a) and 8(b) respectively show basic and optimised hardware implementations of r2[t]. FIG. 9 shows how the circuits of FIGS. 7(b) and 8(b) can be merged into an optimized hardware implementation of $r \bigcirc r[t]$. Given the earlier description of the blocks in FIG. 4, a skilled person will be able to understand FIGS. 7(a) to 9 readily without the need for further discussion here. For the avoidance of doubt however, it will be stated here that blocks 22 and 24 perform the specified subtractions if the specified logical conditions are satisfied, block 26 returns the integer part of the result obtained by dividing the output of the preceding adder by R and block 28 triggers the advance of the connected counter and the reloading of the connected register if a>b.

To be able to accommodate in-place addressing for a fourth data block, it is possible to extend the previous logic and have $r \bigcirc r \bigcirc r[t]$. However, it would require even more complicated hardware for address generation. Instead, FIG. 6 can be extended from the left-hand side by producing:

$$w'' \bigcirc w''[t] = (w''[t] \bmod C)R + \lfloor w''[t]/C \rfloor$$

This means that the order of complexity for accommodating a fourth block is the same as $r \bigcirc r[t]$ $$w'' \circ w''[t] = (w''[t] \bmod C) R \lfloor w''[t]/C \rfloor =$$

$$\underbrace{([(w''[t] \bmod C)R + \lfloor w''[t]/C \rfloor] \bmod C)R}_{w1[t]} + \underbrace{\lfloor w''[t]/C \rfloor}_{w2[t]} \ w1[t] =$$

$$\left( \left[ (t \bmod C) \left( \frac{R \bmod C}{L} \right) \right] \bmod C + \lfloor t/C \rfloor \bmod C \right) R$$

Figure 10A:
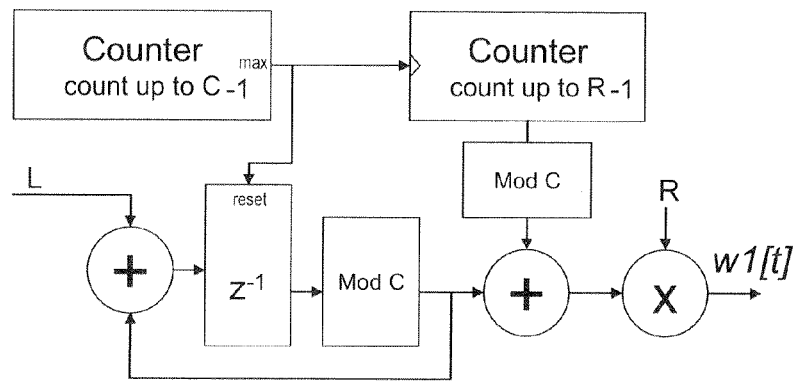
FIG. 10a schematically illustrates a subcircuit of an address sequence generator.
Figure 10B:
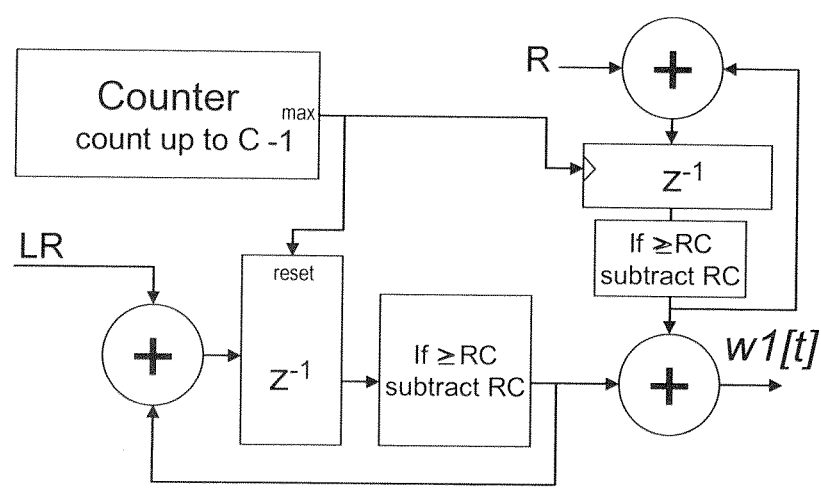
Figure 11:
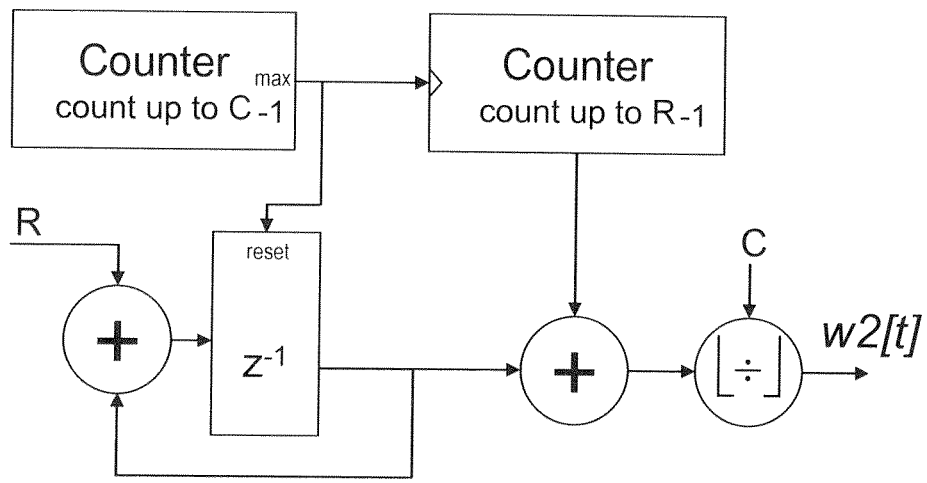
FIG. 11 schematically illustrates a subcircuit of an address sequence generator.
Figure 12:
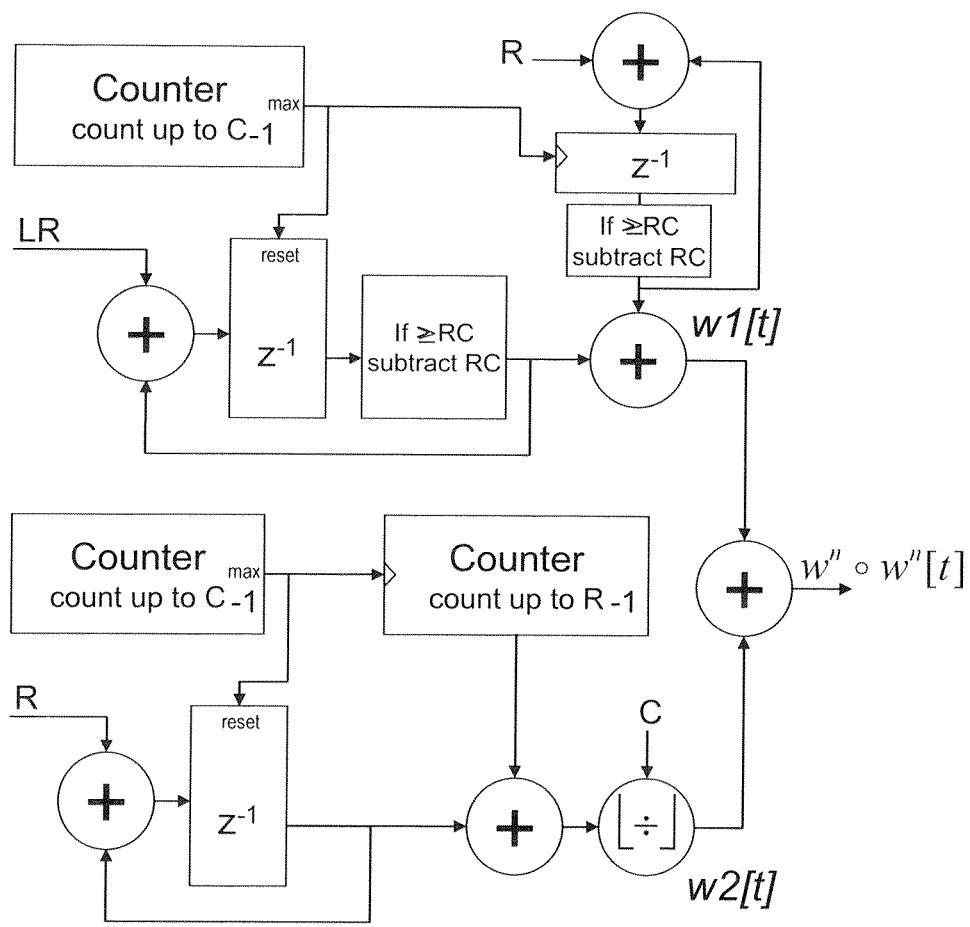
FIG. 12 schematically illustrates an address sequence generator that combines the subcircuits of FIGS. 10b and 11.

FIGS. 10(a) and 10(b) respectively show basic and optimised hardware implementations of w1[t], FIG. 11 shows a hardware implementation of w2[t] and FIG. 12 shows a hardware implementation for $w'' \bigcirc w''[t]$. Given the earlier description of the blocks in FIGS. 4, 5 and 7(a) to 9, a skilled person will be able to understand FIGS. 10(a) to 12 readily without the need for further discussion here.

The calculation of w2[t] involves the division $w''[t]/C$. Division can be implemented using fixed dividers when C has a small range. Any integer division by a C value can be represented as a multiplication by its inverse 1/C. When 1/C is represented with enough precision in binary form, the division $w''[t]/C$ becomes a summation of right shifted versions of $w''[t]$. To exemplify the division method, consider the C values {9, 10, 11, 12} that are required in the LTE standard. The values of 1/C values taken can be represented in binary as:

1/9=0.0001000111000111 . . .
1/10=0.00011001100110011 . . .
1/11=0.0001011010001011101 . . .
1/12=0.000010101010101 . . .

Defining a shift of n bits to the right as >>n, the example of x/9 can be rewritten:

$$x/9 = x >> 4 + x >> 5 + x >> 6 + x >> 10 + x >> 11 + x >> 12 +$$

In a more optimal way, it can be written:

$$x/9 =$$

$$\underbrace{(x >> 4 + x >> 5 + x >> 6)}_{q} + \underbrace{(x >> 4 + x >> 5 + x >> 6)}_{q} >>$$

$$6 + \dots x/9 = q + q >> 6 + q >> 12 + \dots$$

q can be simplified even further:

$$q = x >> 3 - x >> 6$$

This would give us an implementation for 1/9 with one subtractor (for q) and two adders (for q+q >>6+q>>12) for a resolution of 18-bit representation which is good enough for the purposes of LTE. Other efficient implementations of shift-add type multiplication/division are available in the literature, and are beyond the scope of the invention.

Figure 13:
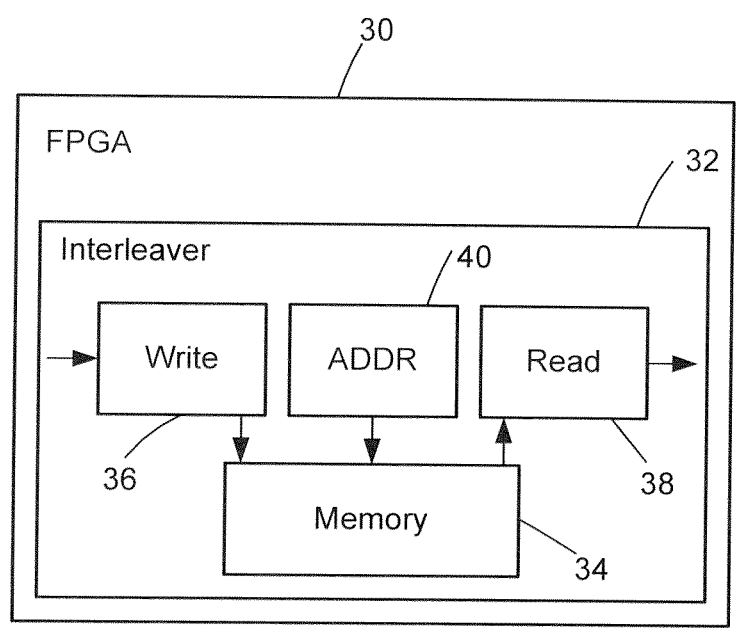
FIG. 13 illustrates schematically a field programmable gate array implementing a row-column interleaver.

The address generation circuits described in FIGS. 4, 5, 9 and 12 can be implemented in hardware, for example as part of an Application Specific Integrated Circuit (ASIC) or by appropriate configuration of resources within a Field Programmable Gate Array (FPGA). FIG. 13 shows the latter case, where an FPGA 30 is configured to implement an interleaver 32. The interleaving is carried out using a memory 34 within the FPGA 30. The FPGA 30 is configured to implement write circuitry 36 for writing data to the memory 34 and read circuitry 38 for reading data from the memory 34. The FPGA 30 also implements addressing circuitry 40 which directs the writing and reading circuitries 36 and 38 to perform the type of row-column interleaving required by the particular application. That is to say, the FPGA 30 implements the addressing circuitry 40, as and when necessary, in the forms shown in FIGS. 4, 5, 9 and 12.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A method of rearranging data within a memory, the method comprising:
    a. writing a first block of data having a first order to a set of locations in the memory in a first sequence, wherein the writing the first block is performed using write circuitry;
    b. reading the set of locations in a second sequence to recover the first block of data in a second order, wherein the reading the set of locations in the second sequence is performed using read circuitry;
    c. writing a second block of data having the first order to the set of locations in the second sequence, wherein the writing the second block is performed using the write circuitry; and
    d. reading the set of locations in a third sequence to recover the second block of data in the second order, wherein the reading the set of locations in the third sequence is performed using the read circuitry;
    wherein:
    e. the writing of the second block of data to the set of locations is performed after the reading of a datum of the first block of data that is stored in a first location according to the second sequence; and
    f. the first order is one of a pair of orders, wherein the pair consists of (1) the second order and (2) a deinterleaved order of a row-column interleaving scheme or an interleaved order of the row-column interleaving scheme.

2. The method of claim 1, wherein the writing of the second block data to the set of locations comprises writing each datum of the second block to a respective location in the set of locations after a first datum of the first block has been read from the respective location and before a second datum of the first block is read from the respective location's succeeding location, if any, according to the second sequence.

3. The method of claim 1, further comprising:
    g. writing a third block of data having the first order to the set of locations in the third sequence; and
    h. reading the set of locations in a fourth sequence to recover the third block of data in the second order;
    wherein:
    i. the writing of the third block of data to the set of locations is performed after the reading of a datum of the second block that is stored in a first location according to the third sequence.

4. The method of claim 3, wherein the writing of the third block of data to the set of locations comprises writing each datum of the third block to a respective location in the set of locations after a first datum of the second block has been read from the respective location and before a second datum of the second block is read from the respective location's succeeding location, if any, according to the third sequence.

5. An apparatus for rearranging data within a memory, the apparatus comprising:
    a. write circuitry arranged to present a first block of data to the memory in a first order and write the first block of data to a set of memory locations in the memory in a first sequence; and
    b. read circuitry arranged to read the set of memory locations in a second sequence to recover the first block of data in a second order;
    wherein:
    c. the write circuitry is further arranged to present a second block of data to the memory in the first order and write the second block of data to the set of memory locations in the second sequence;
    d. the read circuitry is further arranged to read the set of memory locations in a third sequence to recover the second block of data in the second order;
    e. the write circuitry is arranged such that the writing of the second block to the set of memory locations is performed after the read circuitry has read a datum of the first block that is stored in a first location according to the second sequence; and
    f. the first order is one of a pair of orders, wherein the pair consists of (1) the second order and (2) a deinterleaved order of a row-column interleaving scheme or an interleaved order of the row-column interleaving scheme.

6. The apparatus of claim 5, wherein the write circuitry is arranged to write each datum of the second block to a respective location in the set of memory locations after a first datum of the first block has been read from the respective location and before a second datum of the first block is read from the respective location's succeeding location, if any, according to the second sequence.

7. The apparatus of claim 5, wherein:
    g. the write circuitry is further arranged to present a third block of data to the memory in the first order and write the third block of data to the set of memory locations in the third sequence;
    h. the read circuitry is further arranged to read the set of memory locations in a fourth sequence to recover the third block of data in the second order; and
    i. the write circuitry is further arranged such that the writing of the third block of data to the set of memory locations is performed after the reading of a datum of the second block that is stored in a first location according to the third sequence.

8. The apparatus of claim 7, wherein the write circuitry is arranged to write each datum of the third block to a respective location in the set of memory locations after a datum of the second block has been read from the respective location and before a datum of the second block is read from the respective location's succeeding location, if any, according to the third sequence.

9. The apparatus of claim 7, further comprising:
    j. a first counter having a count value that advances cyclically between lower and upper values;

k. a second counter having a count value indicating a number of times a first logical condition has been met since the first counter last started counting from the lower value towards the upper value;
l. a conditional arithmetic unit arranged to subtract a predetermined value from a first register value if a second logical condition is met;
m. a first adder arranged to add an output value of the conditional arithmetic unit to an output of a second register; and
n. a second adder arranged to add outputs of the first adder and the second counter; wherein values issued by the second adder as the first and second counters advance provide an addressing sequence for addressing the set of memory locations.

10. The apparatus of claim 9, wherein the addressing sequence is the first sequence and the first order is the interleaved order.

11. The apparatus of claim 9, wherein the addressing sequence is the fourth sequence and the first order is the deinterleaved order.

12. The apparatus of claim 7, further comprising:
o. an arithmetic unit arranged to supply an integer part of a division operation;
p. a counter arranged to control a numerator in the division operation;
q. a first conditional arithmetic unit arranged to subtract a first predetermined amount from a first register value if a first logical condition is met;
r. a second conditional arithmetic unit arranged to subtract a second predetermined amount from a second register value if the first logical condition is met;
s. a first adder arranged to add output values of the first and second conditional arithmetic units; and
t. a second adder arranged to add output values of the arithmetic unit and the first adder;
wherein values issued by the second adder as the counter advances provide an addressing sequence for addressing the set of memory locations.

13. The apparatus of claim 12, wherein the addressing sequence is the first sequence and the first order is the deinterleaved order.

14. The apparatus of claim 12, wherein the addressing sequence is the fourth sequence and the first order is the interleaved order.

15. The apparatus of claim 5, further comprising:
u. a first counter having a count value that advances cyclically between lower and upper values;
v. a second counter having a count value that advances cyclically between lower and upper values;
w. a first adder arranged to attempt to increment a register value by a predetermined amount each time the first and second counters advance; and
x. a second adder arranged to add the register value to the count value of the second counter;
wherein the register value is reset when the count value of the first counter reaches a limit and values issued by the second adder as the first and second counters advance provide an addressing sequence for addressing the set of memory locations.

16. The apparatus of claim 15, wherein the addressing sequence is the first sequence and the first order is the interleaved order.

17. The apparatus of claim 15, wherein the addressing sequence is the third sequence and the first order is the interleaved order.

18. The apparatus of claim 15, wherein the addressing sequence is the first sequence and the first order is the deinterleaved order.

19. The apparatus of claim 15, wherein the addressing sequence is the third sequence and the first order is the deinterleaved order.

20. A field programmable gate array arranged to implement the apparatus of claim 5.

* * * * *